United States Patent [19]

Takamatsu

[11] Patent Number: 4,754,435
[45] Date of Patent: Jun. 28, 1988

[54] SEMICONDUCTOR DEVICE HAVING A MEMORY CIRCUIT

[75] Inventor: Ryoichi Takamatsu, Tokyo, Japan

[73] Assignee: NEC Corporation, Tokyo, Japan

[21] Appl. No.: 829,578

[22] Filed: Feb. 14, 1986

[30] Foreign Application Priority Data

Feb. 14, 1985 [JP] Japan ................. 60-27065

[51] Int. Cl.⁴ ................ G11C 8/00; G06F 9/30
[52] U.S. Cl. .................... 365/230; 364/200
[58] Field of Search ........... 365/189, 230, 233, 49; 364/200 MS File

[56] References Cited

U.S. PATENT DOCUMENTS

4,312,034 1/1982 Gunter et al. ............ 364/200
4,363,091 12/1982 Pohlman, III et al. ..... 364/200
4,449,184 5/1984 Pohlman, III et al. ..... 364/200

Primary Examiner—Joseph A. Popek
Attorney, Agent, or Firm—Sughrue, Mion, Zinn, Macpeak & Seas

[57] ABSTRACT

A semiconductor device having a memory array on a semiconductor chip includes an internal address producing circuit on the same semiconductor chip. The internal address producing circuit produces an internal address actually designating a memory cell or cells in the memory array according to an external address and a base address stored in a register formed on the semiconductor chip. The internal address produced by the producing circuit has a bit length longer than that of the external address.

24 Claims, 5 Drawing Sheets

| INTERNAL ADDRESS | FIG. 1 | | FIG. 4 | |
|---|---|---|---|---|
| | UPPER | LOWER | LATCH | EXTERNAL ADDRESS |
| A : 100 | 0 0 | 0 0 1 1 0 0 1 0 | 0 0 | 0 0 0 0 0 0 0 0 |
| B : 300 | 0 0 | 1 0 0 1 0 1 1 0 | 0 1 | 0 0 0 0 0 0 0 0 |
| C : 700 | 0 1 | 0 1 0 1 1 1 1 0 | 1 0 | 0 0 0 0 0 0 0 0 |
| D : 1000 | 1 0 | 1 1 1 0 1 1 1 0 | 1 1 | 0 0 0 0 0 0 0 0 |

SEMICONDUCTOR DEVICE HAVING A MEMORY CIRCUIT

BACKGROUND OF THE INVENTION

1. Field of the Invention

The present invention relates to a semiconductor device having a memory circuit, and particularly to a semiconductor memory device having a larger internal address space than an external address space.

2. Description of the Prior Art

With the advance of semiconductor device technology a large capacity memory can now be formed on a single semiconductor chip. Such a memory with a large capacity has a large address space, so that a long address must be applied thereto. For instance, an external address consisting of 16 bits has to be used to access a 64K×1 bit memory. For a 4K word memory (8 bits/word), 12 bits are required as an external address applied to an external address input port of the memory. These large capacity memories can not be directly accessed by a short external address (e.g. 8-bit address or 10-bit address). In the prior art, therefore, a central processing unit (CPU) device which generates only a short address could not be directly coupled to the large capacity memory device via an external address bus.

To access the large capacity memory device by using a CPU device with a short CPU address, a peripheral device to expand the CPU address must be put between the memory device and the CPU device. However, such peripheral device requires a complex hardware circuit, and control of the interface between the CPU device and the memory device becomes difficult. Further, when a plurality of memory devices are employed, each of which has the same address space as the CPU address space, device selection becomes complex in addition to complexity of the system structure.

To avoid these defects, an overlay technology has been proposed. This technology is effective to access a large memory capacity by means of a short CPU address space. However, according to the overlay system, a part of memory corresponding to the CPU address space must be firstly loaded to a rewritable memory device, and thereafter the CPU device has to read out the loaded information from the rewritable memory device. Therefore, the technology has the disadvantage that a memory access speed is very slow.

Furthermore, the large capacity memory contains in general a plurality of application programs or operating systems in arbitrary address spaces. These address spaces are not fixed but variable. In the prior art addressing, an upper address portion is used to designate a start location of one of the memory blocks, and a lower address portion is used to designate each location in the designated memory block. It should be noted that the large capacity memory is divided into memory blocks with a constant address space. However, as described above, since the address space assigned to each of the application programs or operating systems is not fixed but variable, each start location does not correspond to start locations of the memory blocks. Therefore, in order to designate the start location of the application program or the operating system, a complex address operation is required.

An object of the present invention is to provide a semiconductor device having a memory circuit which can be accessed by an external address which is shorter than an internal address of the semiconductor device.

Another object of the present invention is to provide a semiconductor memory device having a larger internal address space than an external address space.

Still another object of the present invention is to provide a semiconductor memory device which can be easily coupled to a CPU device whose address space is smaller than that of the memory device.

Still another object of the present invention is to provide a memory device containing a plurality of programs or informations stored in arbitrary address spaces, each address space being accessed by means of an easy address operation.

SUMMARY OF THE PRESENT INVENTION

The semiconductor device having a memory circuit of the present invention comprises a memory section storing information, an address decoder coupled to the memory section, an output section coupled to the memory section for deriving information from the memory section according to the decoding operation of the address decoder, an input section receiving an external address, a register section storing at least one base address, and an internal address producing section having its input end coupled to the input section and the register section and having its output end coupled to the address decoder and producing an internal address to be decoded by the address decoder in accordance with the external address and the base address. The above described memory section, address decoder, output section, input section, register section and internal address producing section are integrated on a single semiconductor chip. The internal address producing section has a function to combine the external address with the base address or has a function to arithmetically calculate the external address and the base address.

According to the present invention, the internal address is produced in the semiconductor chip by the internal address producing section. The internal address producing section receives the external address (e.g. a CPU address) and the base address which is preliminarily prepared in the register section. Thus, the memory device can be coupled to an external device generating the external address without the complex peripheral device. Further, when both the external address and the base address are combined or when the base address having a bit length longer than that of the external address is prepared, the internal address space becomes larger than the external address space. Thus, a large capacity memory device can be accessed by using a short external address. Moreover, in the case that a start address of each program or information (e.g. application programs, operating systems, tables) is stored in the register section, each program or information can be directly accessed with an easy address operation, even if each program or information is located in an arbitrary address space.

DETAILED DESCRIPTION OF THE EMBODIMENTS

Figure 1:
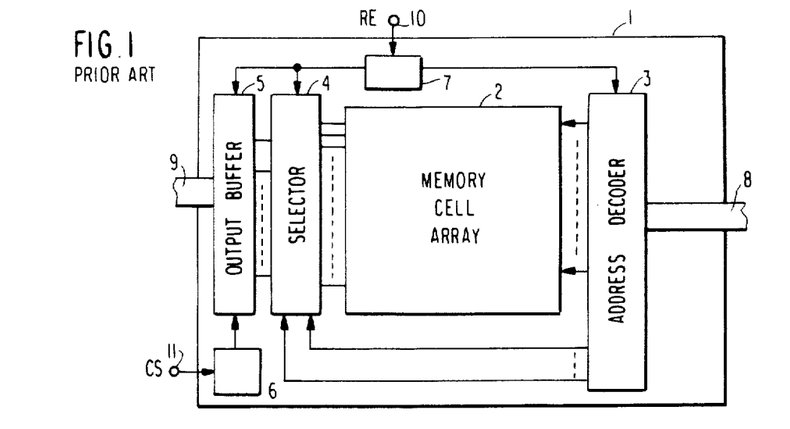
FIG. 1 shows a block diagram of a conventional memory device.
Figure 2:
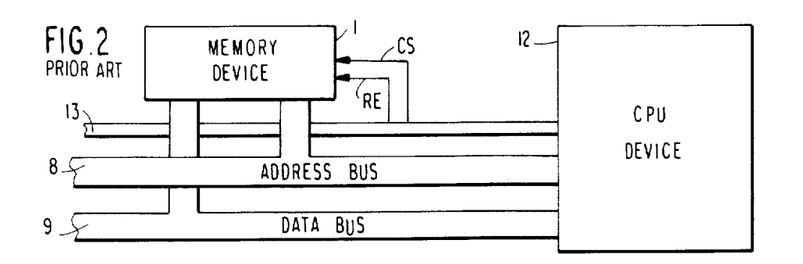
FIG. 2 shows a system block diagram of the memory device of FIG. 1 and a CPU device.

FIG. 1 is a block diagram of a conventional mask ROM type memory device in which a memory cell array 2, an address decoder 3, a selector 4, an output buffer 5, a chip select control circuit 6 and a timing control circuit 7 are integrated on a single semiconductor chip 1. Such a memory device is well known and is generally used in various fields. When a chip select signal CS is applied at a terminal 11, the output buffer 5 is activated by the control circuit 6. In addition, when a read control signal RE is applied at a terminal 10, the timing control circuit 7 generates predetermined timing signals and sends them to the respective elements to place them in a read condition. The address decoder 3 receives an external address through an external address bus 8 and decodes it. According to the decoding operation, information is read out from the memory cell array 2 and is transferred to the output buffer 5 via the selector 4. The output buffer 5 transfers the read-out information to an external data bus 9. In this memory device, an internal address space assigned to the memory cell array 2 must be the same size as that of an external address space. In other words, the external address must have a bit length by which the full space of the internal address space can be designated. For instance, when the capacity of the memory cell array is 16K bytes (8 bits/byte), 14 bits are required as the external address. Therefore, if an external device (e.g. a CPU device 12) has a 16-bit address, the memory device 1 can be coupled to the CPU device 12 through the address bus (16 bits) as shown in FIG. 2. In FIG. 2, the chip select signal CS and the read control signal RE are applied from the CPU device 12 to the memory device 1 through a control bus 13.

On the other hand, when the external address outputted from the CPU device is shorter than 16 bits, the memory device 1 can not be accessed by only the external address on the address bus 8. Therefore, a complex interface device is required between the memory device 1 and the CPU device to expand the external address (CPU address) to the internal address of the memory device 1.

Figure 3:
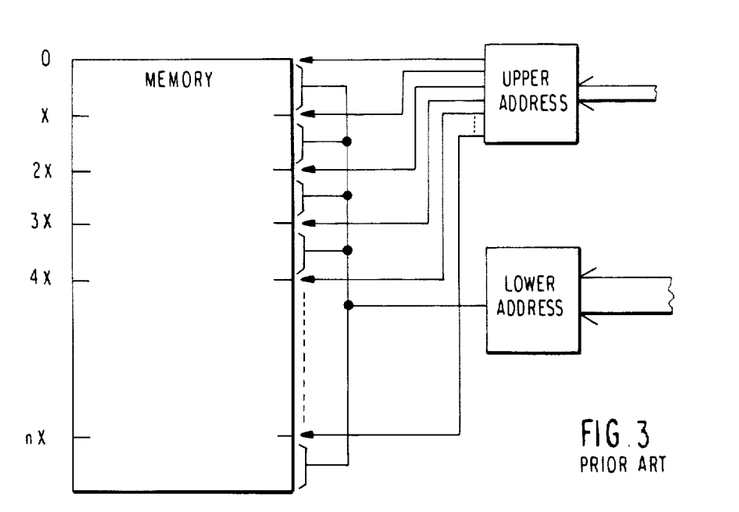
FIG. 3 shows a memory map according to the conventional addressing.

Further, the conventional large capacity memory having a large address space is divided into a plurality of memory blocks with a constant (fixed) address span (X) as shown in FIG. 3. In the conventional addressing of the large capacity memory, an upper address portion is used to designate a start location of each memory block and a lower address portion is used to designate locations in each memory block. Therefore, a memory block selection is easy in the conventional addressing because a start location of each memory block can be designated by the upper address portion. However, the locations which can be designated by the upper address portion are fixed at the start locations of memory blocks. Consequently, when an arbitrary location in a memory block is required as a program start location, both the upper portion and the lower portion of the address (external address) must be arranged or modified in the CPU device or the interface device.

Figure 4:
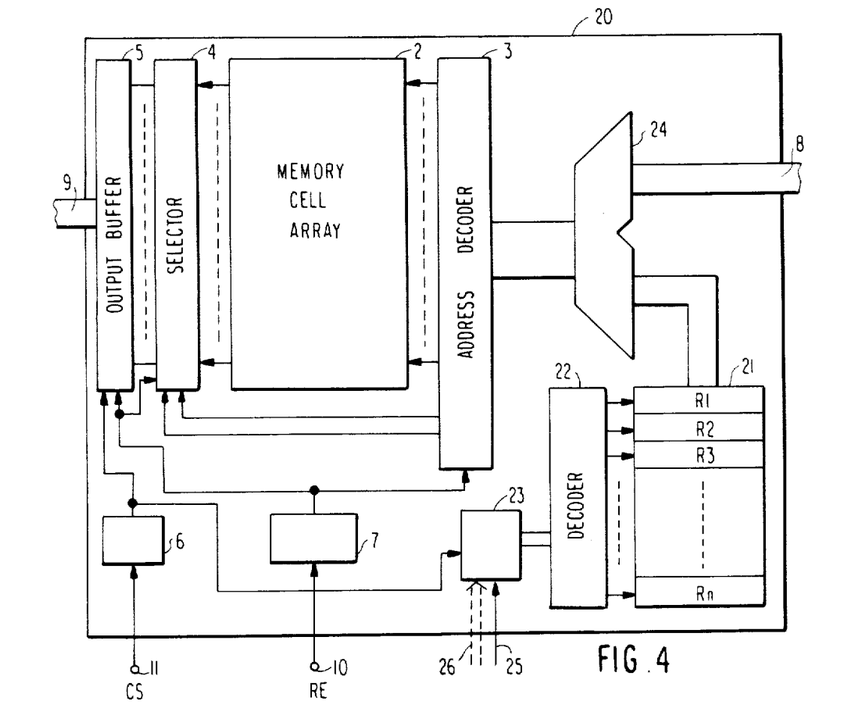
FIG. 4 shows a block diagram of an embodiment of a memory device according to the present invention.

FIG. 4 is a block diagram of a memory device according to an embodiment of the present invention. The memory cell array 2, the address decoder 3, the selector 4, the output buffer, the chip select control circuit 6 and the timing control circuit 7 are formed on a single semiconductor chip 20 and may be the same circuit structure and function as those of the conventional memory device 1 in FIG. 1.

Figure 5:
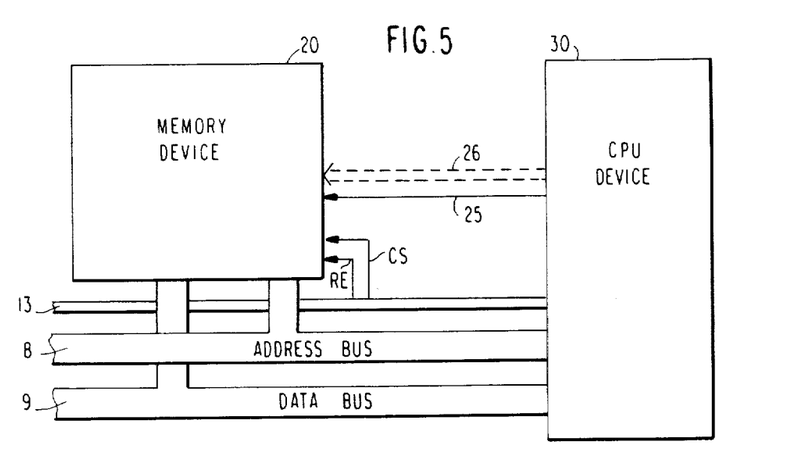
FIG. 5 shows a system block diagram of a CPU device and the memory device shown in FIG. 4.

In FIG. 4, a plurality of registers ($R_1$ to $R_n$) 21, a decoder 22, a latch circuit 23 and an arithmetic unit 24 are formed on the same semiconductor chip 20 to produce an external address on the semiconductor memory chip 20. A plurality of base addresses are preliminarily stored in the respective registers 21, and one of them is selected by the decoder 22. The decoder 22 decodes a data stored in the latch circuit 23 and generates a selecting signal to select one of registers. The latch circuit 23 is activated in response to the chip select signal CS and stores the data designating one register. The data may be transferred to the latch circuit 23 through either single signal line 25 in a serial mode or a plurality of signal lines 26 in a parallel mode. When the data is transferred from the CPU device 30, the memory device 20 will be coupled to the CPU device 30 as shown in FIG. 5.

In FIG. 4, it should be noted that the external address on the external address bus 8 is not directly applied to the address decoder but is applied to one input end of the arithmetic unit 24 which is typically an adder 24. The arithmetic unit 24 receives a base address read out of a selected register at the other input end. The arithmetic unit (adder) 24 adds the external address and the base address in a weighted manner, as shown in the right column (FIG. 4) of FIG. 10. Namely, the unit 24 adds the contents of the base address (LATCH) as the upper bits and the contents of the external address as the lower bits to generate the internal address. The physical utilization of the contents of the base address and the contents of the external address is shown as "21" and "8" in FIG. 6.

According to the memory device in FIG. 4, when the base address with a bit length corresponding to the internal address space of the memory cell array is stored in the register 21, the external address with a shorter space than the internal address space can be used. Therefore, the memory device 20 can be accessed by the short external address without any interface devices to expand the external address.

Figure 6:
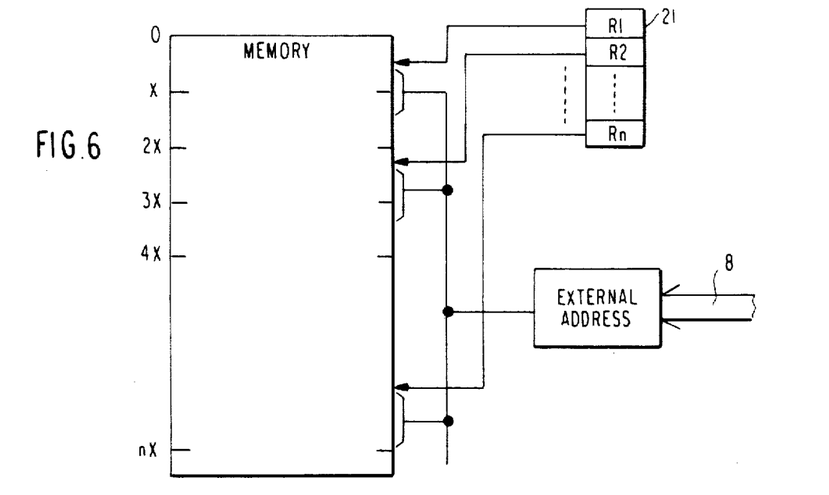
FIG. 6 shows a memory map according to the present invention.

Now, it will be assumed that the CPU address is 8 bits and the memory cell array 2 has 16K words (8 bits/word) capacity. In this case, a 14-bit external address is required to directly access an arbitrary address in the memory cell array 2. Therefore, the CPU device with an 8-bit CPU address is not easily coupled to the memory device 20. In FIG. 4, however, since the base address of 14 bits is stored in the register 21, the CPU device having an 8-bit CPU address can be directly coupled to the memory device via the external address bus 8. Further, in this condition, an arbitrary location in the memory cell array 2 is directly designated by the base address, and the following locations are designated by the external address on the address bus 8 as shown in FIG. 6. Thus, according to the memory device in FIG. 4, a start address can be arbitarily designated by changing the base address.

Figure 7:
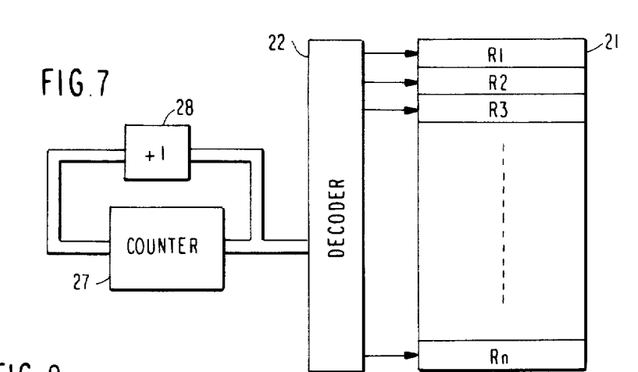
FIG. 7 shows a block diagram in an essential part of another embodiment according to the present invention.

Further, in the case that a counter 27 and an incrementing circuit 28 are employed instead of the latch circuit 23, the registers $R_1$ to $R_n$ are sequentially selected according to the content of the counter 27 as shown in FIG. 7. Thus, the signal line 25 or lines 26 can be omitted in FIG. 4.

Figure 8:
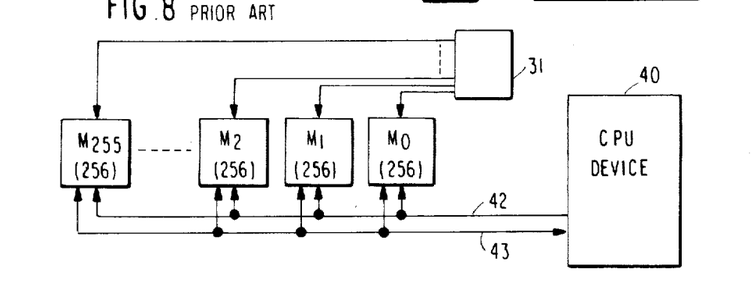
FIG. 8 shows a system block diagram of the prior art microcomputer system.

When a CPU device 40 with an 8-bit CPU address accesses 64K bits of memory, 256 memory chips $M_0$ to $M_{255}$, each of which has 256 bits capacity, must be coupled in parallel to an 8-bit CPU address bus 42 and a data bus 43 in the prior art as shown in FIG. 8. In contrast, the CPU device with the 8-bit CPU address can be directly coupled to a 64K bit memory device 41 via the 8-bit CPU address bus 42 and the data bus 43. Moreover, a chip select unit 31 can be also omitted, so that a system structure becomes very simple in the present invention.

Figures 9, 10:
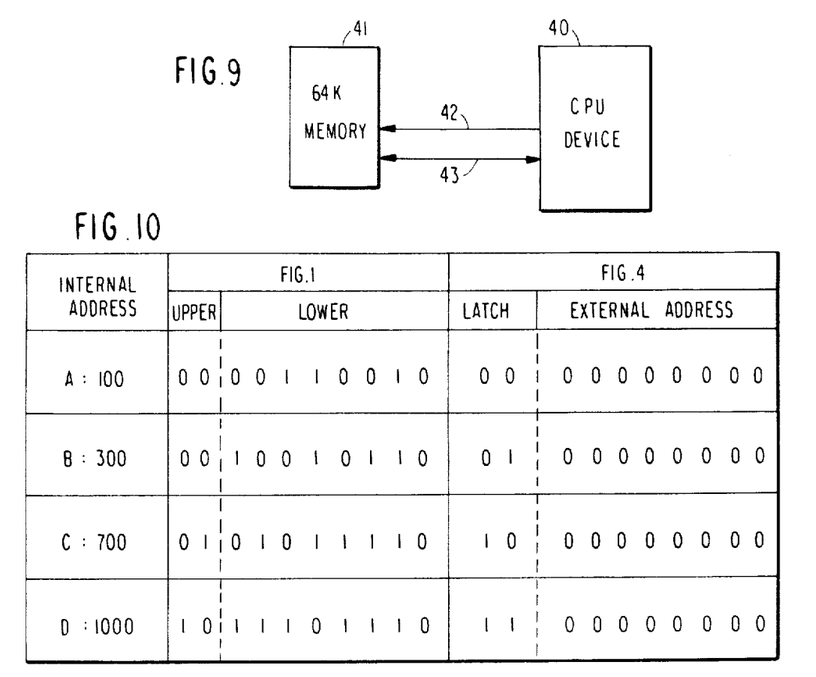
FIG. 9 shows a system block diagram of an embodiment of a microcomputer system according to the present invention.
FIG. 10 shows an address map indicating the prior art addressing and the addressing of one example of the present invention.
Figure 11:
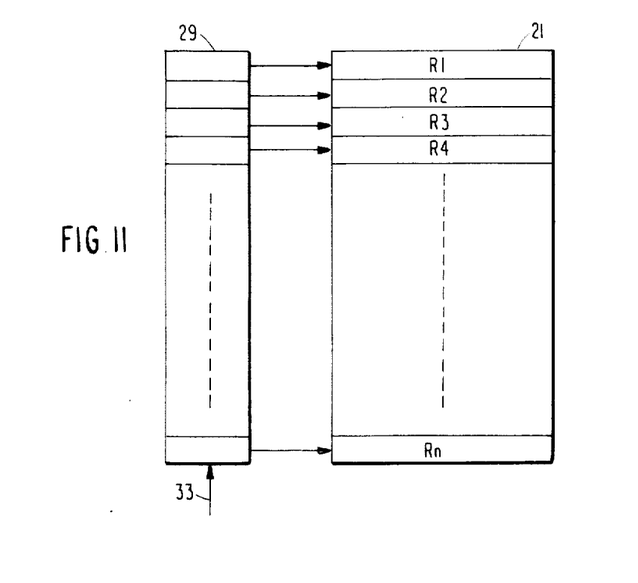
FIGS. 11 and 13 show block diagrams of a register section in the other embodiments of the present invention, respectively.

FIG. 10 indicates address maps of the prior art memory device 1 in FIG. 1 and the memory device 20 in FIG. 4. It is assumed that four programs A to D are stored in the memory cell array. Start addresses of the programs A to D are 100, 300, 700 and 1000, respectively. To access these four programs, a 10-bit external address is required in the memory device of FIG. 1, and complex bit patterns must be put into an upper portion and a lower portion of the external address. Therefore, the CPU device has to produce these address bit patterns by executing a complex address operation.

While, in the memory device 20 of FIG. 4, a two-bit latch circuit and four 10-bit registers $R_1$ to $R_4$ are used. The addresses 100, 300, 700 and 1000 are preliminarily stored in the registers $R_1$ to $R_4$, respectively. To access the program A, the CPU device outputs the CPU address of 8 bits "00000000" through the external address bus 8 and sets the data "00" into the latch circuit 23. Thus, the start address of the program A can be accessed. The other programs B, C and D can be accessed in the same manner as the program A by changing the content of the latch circuit. That is, the CPU device may transfer the same address (all zero) to the memory device for these four programs. Therefore, only a simple address operation is required to the CPU device.

Figure 12:
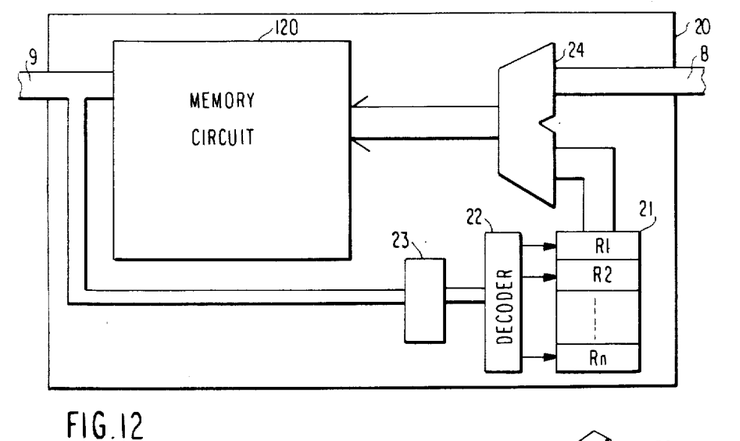
FIGS. 12 and 14 show block diagrams of still other embodiments of memory devices in the present invention, respectively.
Figure 13:
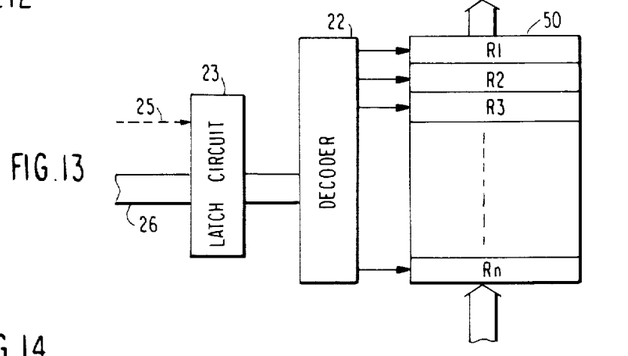
Figure 14:
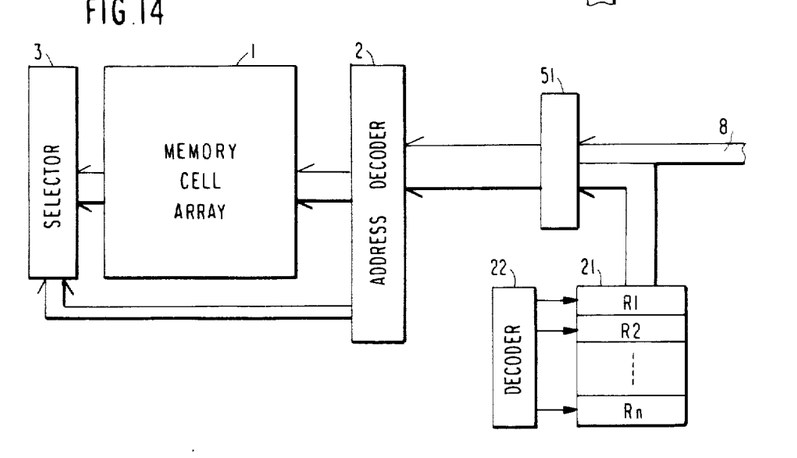

The registers 21 may be selected according to an output of a shift register 29 responsive to a shift clock 33. Further, the memory device 20 can be modified as shown in FIG. 12. In FIG. 12, the data to be stored in the latch circuit 23 is sent to the latch circuit 23 through the data bus 9. A memory circuit 120 contains elements of FIG. 1. Moreover, a rewritable memory (RAM, PROM, EPROM, EEPROM, etc.) or a queue memory 50 can be used as the register 21 as shown in FIG. 13. The base addresses to be stored in the memory 50 are transferred through the data bus 9. The base address in the registers 21 may be used as an upper address of the internal address and the external address may be used as a lower address. In this case, a combination circuit 51 is employed in place of the arithmetic unit 24.

What is claimed is:

1. A semiconductor device comprising a memory cell array having an address space which can be accessed by an internal address with a first bit length, means for receiving an external address with a second bit length shorter than said first bit length, base address storing means for storing at least one base address, means for producing said internal address according to said external address and said base address, an address decoder responsive to the internal address produced by said producing means to generate decoder output signals representing a memory location designated by said internal address, means responsive to said decoder output signals for reading out information from said memory array, and an output means for transferring the read-out information to an output end of the semiconductor device.

2. A semiconductor device as claimed in claim 1, wherein said base address storing means stores a plurality of said base addresses, said device further comprising base address selection means for receiving base address selection data representing a required base address, and means for reading out one of said plurality of base addresses in accordance with said base address selection data, said one of said plurality of base addresses read out of said base address storing means being provided to said producing means for producing said internal address.

3. A semiconductor device as claimed in claim 1, further comprising means for changing a content of the base address stored in said storing means.

4. A semiconductor device as claimed in claim 1, in which said producing means produces said internal address by performing an arithmetic operating function on said external address and said base address.

5. A semiconductor device having a memory circuit, an external address input circuit for receiving an external address, an address decoder responsive to said received external address for generating decoder output signals representing a memory location, and an output circuit for reading out a content of in accordance with said decoder output signals, all of said memory circuit, address decoder, external address input circuit and output circuit being disposed on a single semiconductor chip, said semiconductor device further comprising a base address register for storing at least one base address, means for reading out a base address of said base address register and means responsive to said external address and said read-out base address for producing said internal address, said base address register, said reading means and said producing means being formed on said semiconductor chip.

6. A semiconductor device as claimed in claim 5, in which a bit length of said external address is shorter than a bit length of said internal address.

7. A semiconductor device comprising a memory circuit having a plurality of memory cells, an input circuit for receiving an external address, an address decoder responsive to an internal address for generating decoder output signals designating at least one memory cell in said memory circuit, an output circuit for reading information out of the designated memory cell or cells, and means coupled to said input circuit for producing said internal address to be decoded by said address decoder, said producing means producing said internal address with a bit length larger than a bit length of said external address.

8. A semiconductor device as claimed in claim 7, in which said memory circuit, said address decoder, said output circuit, said input circuit and said producing means are integrated on a single semiconductor chip.

9. A semiconductor memory device having a memory section with a first address space, an input means for receiving an external address from an external device, said external address having fewer bits than are required to address all of said first address space, said device further comprising means for storing at least one data, means for accessing said memory section in accordance with an internal address to thereby read information signals out of said memory section, and an output means for providing said information signals to an external data bus coupled to said external device, and means responsive to said data and said external address for producing said internal address, said internal address having a bit length enough to separately address all memory locations in said first address space.

10. A semiconductor device as claimed in claim 9, further comprising means for receiving data from said external device and for writing said data through said external data bus into said storing means.

11. A semiconductor memory device formed on a single semiconductor chip, comprising a memory cell array having an address space which can be accessed by an address of a first bit length, means for receiving an external address of a second bit length shorter than said first bit length, storing means for storing at least one base address of a third bit length shorter than said first bit length, producing means for producing said address of said first bit length according to said external address and said base address, an address decoder responsive to the address produced by said producing means for selecting a part of said memory cell array, means for extracting information from said selected part of said memory array, and an output means for transferring the extracted information to the outside of the semiconductor memory device.

12. A semiconductor device as claimed in claim 11, wherein said address of said first bit length is composed of more significant bits determined by said base address and less significant bits determined by said external address.

13. A semiconductor device as claimed in claim 11, further comprising means for changing the base address stored in said storing means before said reducing means produces said address.

14. A semiconductor device as claimed in claim 11, in which said producing means has an adder.

15. A memory device comprising a memory cell array, said memory cell array being divided into a plurality of memory blocks each having a constant address span, first means for receiving an external address supplied via an address bus of a first bit length from the outside of the memory device, second means for storing a plurality of internal addresses, each of said internal addresses having a second bit length shorter than said first bit length, third means receving a designation signal having a bit length shorter than said second bit length from the outside via a signal line other than said address bus for designating one of said internal addresses, fourth means responsive to the designated internal address for selecting one of said memory blocks, fifth means responsive to said external address for selecting a part of the selected memory block, and sixth means for operatively extracting information stored in the selected part of the selected memory block.

16. The memory device according to claim 15, in which said second means includes a register having a plurality of storage locations storing each of said internal addresses representing said memory blocks and said third means includes a selection circuit for operatively designating one of said storage locations in response to said designation signal.

17. The memory device according to claim 15, in which said sixth means includes an output buffer circuit.

18. The memory device according to claim 15, further comprising seventh means for receiving a chip select signal and eighth means for enabling said third to sixth means in response to said chip select signal.

19. A semiconductor memory device formed on a single semiconductor chip, comprising a memory cell array having an address space which is designated by address information of a first bit length, address input means for receiving an external address of a second bit length from the outside of said semiconductor chip, said second bit length being shorter than said first bit length, a plurality of registers each storing a base address of a third bit length shorter than said first bit length, means for selecting one of said registers to extract the base address stored in the selected register, means for producing an internal address of said first bit length in accordance with said external address and the extracted base address, a selection circuit responsive to said internal address for designating a part of said memory array, and an output circuit for operatively outputting information stored in the designated part of said memory array to the outside of said semiconductor chip.

20. The memory device according to claim 19, in which said memory array is divided into a plurality of memory blocks each including a plurality of storage locations and said selection circuit selects one of said memory blocks in accordance with a content of the selected base address and selects a part of the storage locations in the selected memory block in accordance with a content of said external address.

21. The memory device according to claim 19, in which said internal address producing means includes an adder receiving said external address and the selected base address.

22. The memory device according to claim 19, in which said selecting means includes a signal receiving data for designating one of said register.

23. The memory device according to claim 19, in which said selecting means includes a counter for selecting one of said registers.

24. A memory system comprising an address bus for carrying an external address of a first bit length; a data bus; a memory device including a memory cell array which is addressable by an internal address of a second bit length, address input means coupled to said address bus for receiving said external address supplied through said address bus, a register for storing a plurality of base addresses each having a second bit length shorter than said second bit length, means for selecting one of said base addresses, an adder receiving said external address of the selected base address to generate said internal address, a selection circuit for operatively selecting a part of said memory array in response to said internal address, and an output circuit coupled to said data bus for operatively outputting information read from the selected part of said memory array.

* * * * *

UNITED STATES PATENT AND TRADEMARK OFFICE
CERTIFICATE OF CORRECTION

PATENT NO. : 4,754,435
DATED : June 28, 1988
INVENTOR(S) : Takamatsu

It is certified that error appears in the above-identified patent and that said Letters Patent is hereby corrected as shown below:

COLUMN 4, LINE 27  Delete "external" and insert --internal--.

Signed and Sealed this

Third Day of January, 1989

Attest:

DONALD J. QUIGG

Attesting Officer

Commissioner of Patents and Trademarks